(12) United States Patent
Schrijver et al.

(10) Patent No.: US 6,542,220 B1
(45) Date of Patent: Apr. 1, 2003

(54) PURGE GAS SYSTEMS FOR USE IN LITHOGRAPHIC PROJECTION APPARATUS

(75) Inventors: Raymond L. J. Schrijver, Eindhoven (NL); Tjarko A. R. van Empel, Eindhoven (NL); Marcel K. M. Baggen, Nuenen (NL); Bernardus A. J. Luttikhuis, Nuenen (NL); Yim Bun P. Kwan, Eindhoven (NL); Erik R. Loopstra, Heeze (NL)

(73) Assignee: ASML Netherlands, B.V., Veldhoven (NL)

( * ) Notice: Subject to any disclaimer, the term of this patent is extended or adjusted under 35 U.S.C. 154(b) by 20 days.

(21) Appl. No.: 09/704,828

(22) Filed: Nov. 3, 2000

(30) Foreign Application Priority Data

Nov. 5, 1999 (EP) .............................................. 99203670
Oct. 24, 2000 (EP) .............................................. 00203675

(51) Int. Cl.$^7$ ........................ G03B 27/42; G03B 27/58; G03B 27/62
(52) U.S. Cl. ............................... 355/53; 355/72; 355/75
(58) Field of Search .............................. 355/30, 53, 55, 355/67–71, 72, 75, 76, 77; 430/5, 3, 20; 310/10, 12; 378/34, 35; 318/649

(56) References Cited

U.S. PATENT DOCUMENTS

| | | | | |
|---|---|---|---|---|
| 5,172,403 A | * | 12/1992 | Tanaka et al. ................. 378/34 |
| 5,559,584 A | * | 9/1996 | Miyaji et al. .................. 355/73 |
| 5,814,381 A | * | 9/1998 | Kuo ............................. 428/14 |
| 5,870,197 A | | 2/1999 | Sogard et al. ............... 356/358 |
| 5,877,843 A | * | 3/1999 | Takagi et al. ................. 355/30 |
| 5,997,963 A | | 12/1999 | Davison et al. ............. 427/582 |
| 6,103,427 A | * | 8/2000 | Storm ............................ 430/5 |
| 6,153,044 A | * | 11/2000 | Klebanoff et al. .......... 156/345 |
| 6,191,843 B1 | * | 2/2001 | Takiguchi .................... 355/30 |
| 6,208,406 B1 | * | 3/2001 | Nakashima ................... 355/30 |
| 6,320,700 B2 | * | 11/2001 | Shiozawa .................... 359/642 |
| 6,337,161 B2 | * | 1/2002 | Chiba et al. ................... 430/5 |

FOREIGN PATENT DOCUMENTS

WO     WO99/57607     11/1999

* cited by examiner

Primary Examiner—Henry Hung Nguyen
(74) Attorney, Agent, or Firm—Pillsbury Winthrop LLP

(57) ABSTRACT

A lithographic apparatus has at least one compartment closely surrounding at least one of the mask and substrate holders but not either of the illumination or projection systems so as to reduce the volume that must be purged with gas transparent to the projection radiation. In a scanner, the compartment surrounding the mask holder preferably moves with the mask table and may be formed by a combination of a frame-shaped mask table driven in the scanning operation and stationary plates fixed relative to the projection and illumination systems.

15 Claims, 8 Drawing Sheets

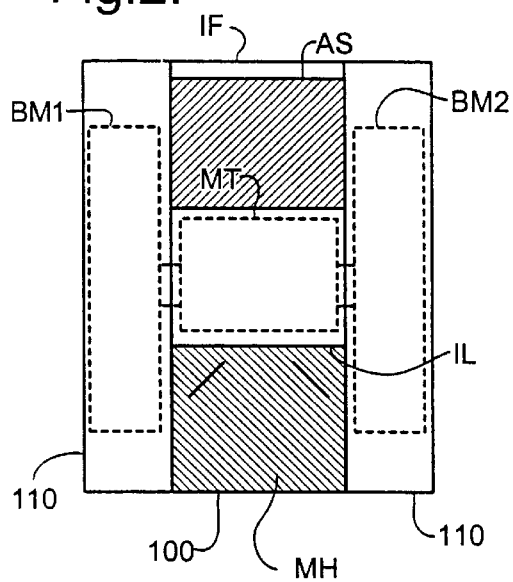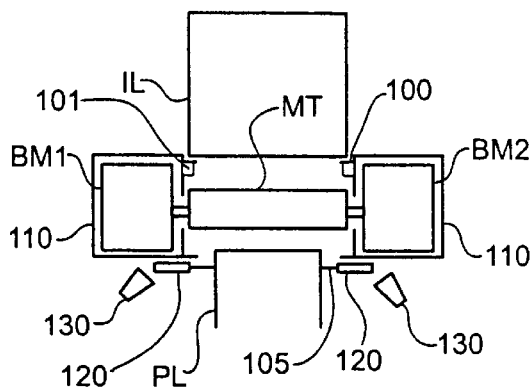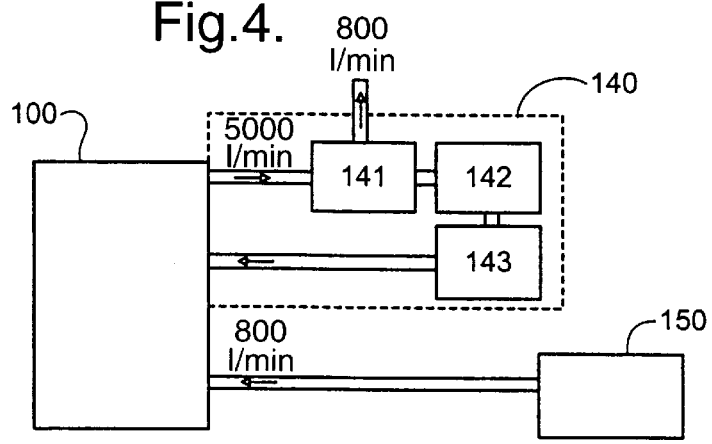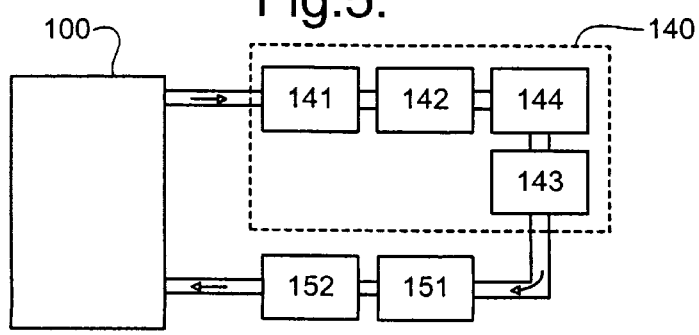

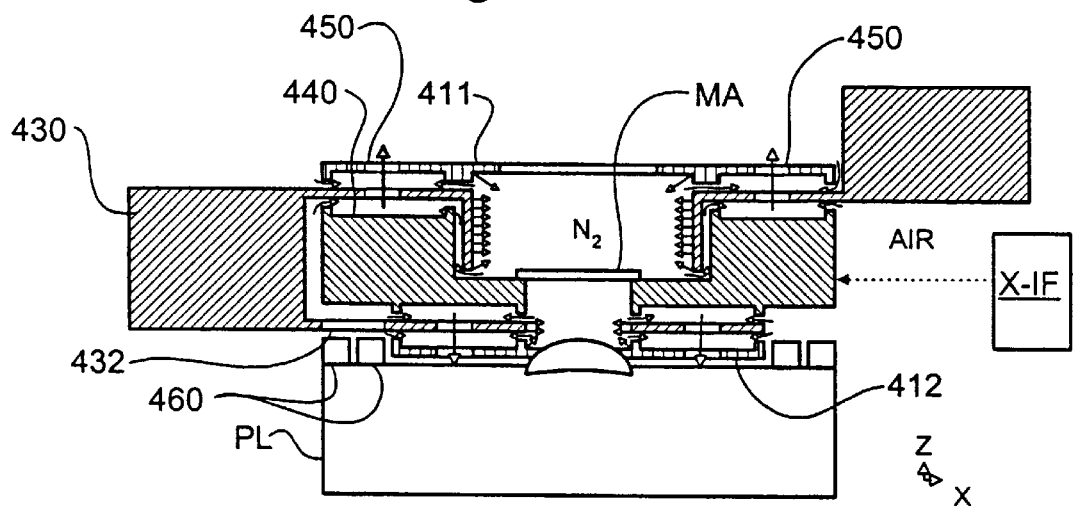
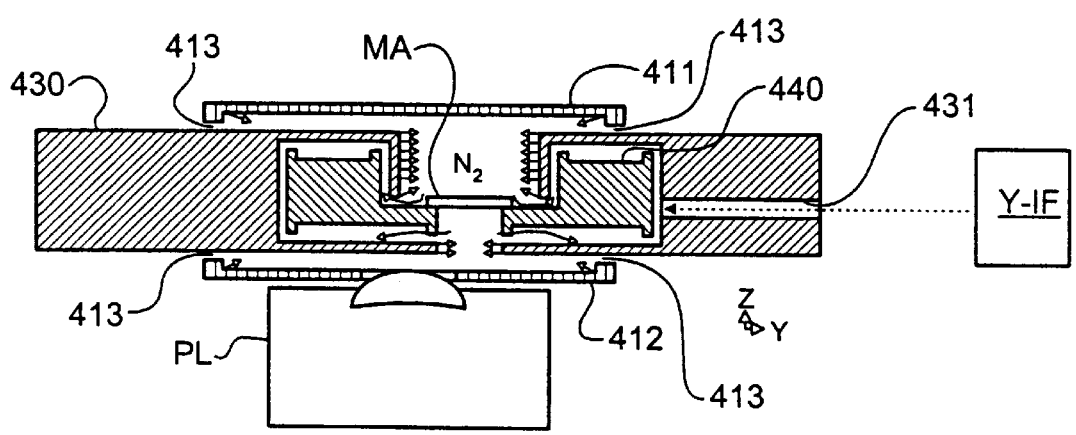
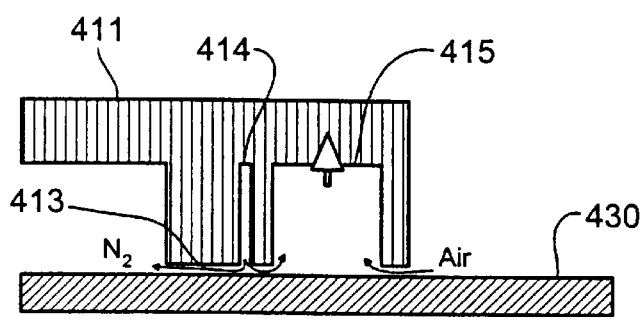

PURGE GAS SYSTEMS FOR USE IN LITHOGRAPHIC PROJECTION APPARATUS

BACKGROUND OF THE INVENTION

1. Field of the Invention

The invention relates to purge gas systems in a lithographic projection apparatus including:

- an illumination system for supplying a projection beam of radiation;
- a first object table for holding a mask;
- a second object table for holding a substrate; and
- a projection system for imaging an irradiated portion of said mask onto a target portion of said substrate.

2. Description of the Related Art

For the sake of simplicity, the projection system may hereinafter be referred to as the "lens"; however, this term should be broadly interpreted as encompassing various types of projection system, including refractive optics, reflective optics, and catadioptric systems, for example. The illumination system may also include elements operating according to any of these principles for directing, shaping or controlling the projection beam, and such elements may also be referred to below, collectively or singularly, as a "lens". In addition, the first and second object tables may be referred to as the "mask table" and the "substrate table", respectively.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target portion (comprising one or more dies) of a substrate (silicon wafer) which has been coated with a layer of radiation-sensitive material (resist). In general, a single wafer will contain a whole network of adjacent target portions which are successively irradiated via the mask, one at a time. In one type of lithographic projection apparatus, each target portion is irradiated by exposing the entire mask pattern onto the target portion at once; such an apparatus is commonly referred to as a wafer stepper. In an alternative apparatus—which is commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from International Patent Application WO97/33205, which is incorporated herein by reference.

In general, lithographic apparatus contain a single mask table and a single substrate table. However, machines are becoming available in which there are at least two independently movable substrate tables; see, for example, the multi-stage apparatus described in International Patent Applications WO98/28665 and WO98/40791. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement positions.

To reduce the size of features that can be imaged, it is desirable to reduce the wavelength of the illumination radiation. Wavelengths of less than 180 nm are therefore currently being contemplated, for example 157 nm or 126 nm. However, such wavelengths are strongly absorbed by normal atmospheric air, leading to unacceptable loss of intensity as the beam traverses the apparatus. Furthermore, contaminants—which may be introduced by, for example, outgassing of the photoresist layer on the substrate—may adsorb onto certain optical elements, such as that lens element (of the projection system) that is nearest to the substrate. The undesirable adsorption of such contaminants will, in general, also lead to detrimental intensity loss. In order to solve these problems, it has been proposed to flush the apparatus with a flow of gas, the gas being substantially transparent to the illumination wavelength, e.g. nitrogen ($N_2$). However, nitrogen gas of the purity necessary to avoid absorption of the exposure radiation, and in the quantities necessary for a flush of the whole apparatus, is expensive.

SUMMARY OF THE INVENTION

It is an object of the invention to provide a lithographic projection apparatus, especially one using radiation substantially absorbed by atmospheric air, in which the consumption of purge gas is reduced.

According to the invention there is provided a lithographic projection apparatus including:

- an illumination system for supplying a projection beam of radiation;
- a first object table for holding a mask;
- a second object table for holding a substrate;
- a projection system for imaging an irradiated portion of said mask onto a target portion of said substrate; characterized by:
  - a compartment closely surrounding at least one of one of said first and second object tables but not surrounding either said illumination system or said projection system, said compartment, in use, being supplied with a purge gas more transparent than air to the radiation of said projection beam.

According to the invention there is also provided a lithographic projection apparatus including:

- an illumination system for supplying a projection beam of radiation;
- a first object table for holding a mask;
- a second object table for holding a substrate; and
- a projection system for imaging an irradiated portion of said mask onto a target portion of said substrate; characterized by:
  - a purge compartment provided between said projection system and said second object table and fixed relative to said projection system.

By providing a compartment closely surrounding either one of said object tables or in the space between the projection system and the substrate table, the volume that must be purged can be substantially reduced, as compared to purging the whole apparatus. As well as the direct saving in purge gas consumption as a result of the reduction in the volume being purged, there are further reductions, since contamination of the purge gas can be reduced, allowing additional reuse, as can leakage of the purge gas. Additionally, the time taken to purge the system back to a sufficiently clean state of operation after the apparatus has been shut down or opened, e.g. for maintenance, is reduced.

Particular additional advantages can be achieved in step-and-scan apparatus where the compartment can be arranged to surround and move with the object rather than surrounding all of the substrate or mask table, drive arrangements and associated components such as sensors. This can be achieved using a combination of a frame, formed as part of the object table, moving between fixed parallel plates, or by forming the object table into a box substantially surrounding the object. Where the compartment is to be formed between the projection system and the substrate (wafer) these items can themselves form opposite sides of the compartment, which may then be defined by ducts fixed relative to the projection lens and forming a frame around the space traversed by the projection beam. A preferential embodiment employs gas flow velocities which are sufficient to completely or partially prevent contaminants (e.g. as introduced by resist outgassing) from adsorbing onto optical elements in the apparatus. Such velocities may, for example, be or the order of about 1 m/s.

The invention also provides a method of manufacturing a device using a lithographic projection apparatus including:

an illumination system for supplying a projection beam of radiation;

a first object table for holding a mask;

a second object table for holding a substrate; and a projection system for imaging irradiated portions of said mask onto target portions of said substrate; the method comprising the steps of:

providing a mask bearing a pattern to said first object table;

providing a substrate provided with a radiation-sensitive layer to said second object table;

irradiating portions of the mask and imaging said irradiated portions of the mask onto said target portions of said substrate; characterized by the step of:

providing purge gas to a compartment closely surrounding at least one of said first and second object tables but not surrounding either said illumination system or said projection system, said purge gas being more transparent than air to the radiation of said projection beam.

In a manufacturing process using a lithographic projection apparatus according to the invention a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices (dies) will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0672504.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "exposure area" or "target portion", respectively.

The radiation used as the projection beam should not be seen as being restricted to the cited examples of radiation having a wavelength of 157 nm or 126 nm; it is conceivable that other wavelengths or types may also be used in the present invention.

BRIEF DESCRIPTION OF THE DRAWINGS

The invention and its attendant advantages will be further described below with reference to exemplary embodiments and the accompanying schematic drawings, in which:

FIG. 2 is a plan view of the mask stage of the lithographic apparatus of FIG. 1, showing the major components;

FIG. 3 is a cross-sectional view of the mask stage of the lithographic apparatus of FIG. 1, showing the major components;

FIG. 4 is a flow diagram of the purge gas system of the first embodiment of the present invention;

FIG. 5 is a flow diagram of the purge gas system according to a variation of the first embodiment of the present invention;

FIG. 21 is a cross-sectional view of the mask stage of a lithographic projection apparatus according to a fourth embodiment of the present invention;

FIG. 22 is a cross-sectional view, taken perpendicularly to FIG. 21, of the mask stage of FIG. 21;

FIG. 23 is a cross-sectional view of a bearing arrangement in the mask stage of FIG. 21;

DETAILED DESCRIPTION OF THE INVENTION

Figure 1:
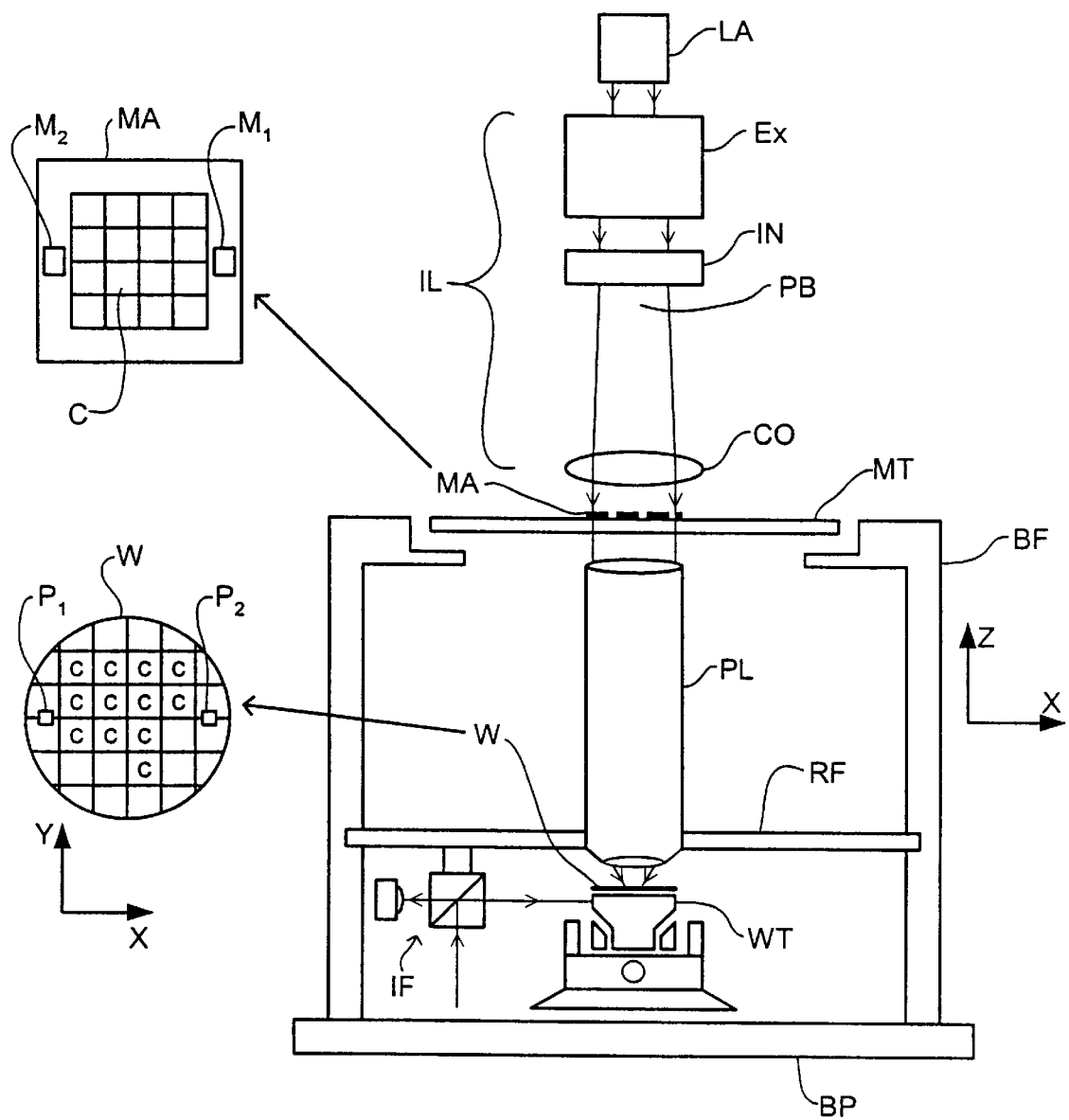
FIG. 1 depicts a lithographic projection apparatus according to a first embodiment of the present invention.

In the drawings, like parts are identified by like reference numerals.

FIG. 1 schematically depicts a lithographic projection apparatus according to the invention. The apparatus comprises:

- a radiation system comprising radiation source LA, and illumination system IL (Ex, IN, CO) for supplying a projection beam PB of radiation (e.g. UV radiation with a wavelength of 157 nm or 126 nm);
- a first object table (mask table) MT provided with a mask, or first object, holder for holding a mask MA (e.g. a reticle), and connected to first positioning means for accurately positioning the mask with respect to item PL;
- a second object table (substrate or wafer table) WT provided with a substrate, or second object, holder for holding a substrate W (e.g. a resist-coated silicon wafer), and connected to second positioning means for accurately positioning the substrate with respect to item PL;
- a projection system ("lens") PL (e.g. a refractive or catadioptric system or a mirror group) for imaging an irradiated portion of the mask MA onto an exposure area C (target portion) of a substrate W held in the substrate table WT.

As here depicted, the apparatus is of a transmissive type (i.e. has a transmissive mask). However, in general, it may also be of a reflective type, for example.

The radiation system includes a source LA (e.g. an Hg lamp or an excimer laser) which produces a beam of UV radiation. This beam is caused to traverse various optical components comprised in the illumination system IL—e.g. beam shaping optics Ex, an integrator IN and a condenser CO—so that the resultant beam PB has a desired shape and intensity distribution in its cross-section. The beam PB subsequently intercepts the mask MA, which is held in a mask holder on a mask table MT. Having traversed the mask MA, the beam PB passes through the lens PL, which focuses the beam PB onto an exposure area C of the substrate W. With the aid of the interferometric displacement measuring means IF, the substrate table WT can be moved accurately by the second positioning means, e.g. so as to position different exposure areas C in the path of the beam PB. Similarly, the first positioning means can be used to accurately position the mask MA with respect to the path of the beam PB, e.g. after mechanical retrieval of the mask MA from a mask library or during scanning motion of the mask. In general, movement of the object tables MT, WT will be realized with the aid of a long-stroke module (course positioning) and a short-stroke module (fine positioning), which are not explicitly depicted in FIG. 1. In the case of a waferstepper (as opposed to a step-and-scan apparatus) the mask table may be connected only to a short-stroke positioning device, to make fine adjustments in mask orientation and position, or it may just be fixed. Most components of the apparatus, including all vibration generating components, are mounted on or from the base plate BP and base frame BF. However, the projection lens, as well as necessary components of the interferometric displacement measuring means and other sensors, are mounted on the reference, or metrology, frame RF, which is mechanically isolated from the rest of the apparatus to provide a stable reference.

The depicted apparatus can be used in two different modes:

1. In step-and-repeat (step) mode, the mask table MT is kept essentially stationary, and an entire mask image is projected at once (i.e. a single "flash") onto an exposure area C. The substrate table WT is then shifted in the X and/or Y directions so that a different exposure area C can be irradiated by the beam PB;
2. In step-and-scan (scan) mode, essentially the same scenario applies, except that a given exposure area C is not exposed in a single "flash". Instead, the mask table MT is movable in a given reference direction (the so-called "scan direction", e.g. the Y direction) with a speed v, so that the projection beam PB is caused to scan over a mask image; concurrently, the substrate table WT is moved in the same or opposite direction at a speed V=Mv, in which M is the magnification of the lens PL (typically, M=¼ or ⅕). In this manner, a relatively large exposure area C can be exposed, without having to compromise on resolution.

FIGS. 2 and 3 show in more detail the mask stage, including mask table MT, of the lithographic apparatus according to the first embodiment.

As shown in FIGS. 2 and 3, the whole of the mask stage of the first embodiment is enclosed in purge compartment 100 which is flushed with a purge gas transparent to the radiation of the projection beam. Suitable compositions for the purge gas are discussed at the end of the description. The mask table MT is connected by long-stroke drive arrangement to balance masses BM1 and BM2 which are encased in respective compartments 110. The long-stroke drive arrangements drive the mask table to scan in the Y direction underneath illumination system IL, and to a mask-exchange position underneath mask handler MH. The position of the mask table is continuously monitored by interferometer IF which directs measurement beams onto mirrors (not shown) mounted on the side face of mask table MT. An air shower AS is provided above the area traversed by the measurement beams for interferometer conditioning. The air shower provides gas of known and constant refractive index, for example the purge gas, at constant temperature to ensure interferometer measurements are not rendered inaccurate by variations in refractive index.

As shown in FIG. 3, the mask stage compartment 100 has openings in the upper surface around the illumination system IL and in the lower surface around the projection lens PL. Gaps in the balance mass compartments 110 are provided for the interface between the long-stroke motors and the mask table MT.

To close the lower part of the mask stage compartment 100, an additional plate 105 is mounted to the projection system PL with labyrinthine seals 120 provided between plate 105 and compartment 100. The labyrinthine seals 120 provide a sufficient seal on the mask compartment 100 but do not involve actual contact between the plate 105 and the mask stage compartment 100, to prevent transmission of vibrations to the projection system PL. Nevertheless, leakage of purge gas from the mask stage compartment can occur around labyrinthine seals 120 and so purge gas exhausts 130 are provided nearby to collect any such leaking purge gas.

The purge gas for the light path in the vicinity of the mask table MT is provided through purge gas outlets 101 provided close to the mask table MT. Gas to purge the remainder of the mask stage compartment 100 is introduced by the air showers for the Y-interferometer beams. The major purge gas exhaust (not shown) is provided at a convenient point in the lower part of the compartment.

To avoid excessive consumption of purge gas, this is largely reused. The supply and reuse system is shown in FIG. 4. Clean purge gas at the required rate is supplied from purge gas supply 150 and is primarily used in the areas most sensitive to absorption, e.g. in the vicinity of the projection beam, and so is directed to the appropriate outlets 101 in the mask stage compartment 100. The less critical gas used in the mask stage compartment 100, such as gas bearings (air bearings) in the long- and short-stroke drive arrangements and gravity compensators (vertical actuators) in the mask table, can be supplied by recycled purge gas with slightly impaired purity. This is exhausted from the mask stage compartment 100 at a relatively high rate by pump/fan 141. The majority of the exhausted purge gas is passed through a filter 142 and heat exchanger 143 before being returned to the mask stage compartment 100. A proportion of the exhausted, "polluted" purge gas, to match the supply of clean purge gas, is vented, or diverted to tanks for off-site reconditioning. The filter 142 removes contaminants from the purge gas while the heat exchanger ensures that it is returned to the mask stage compartment at the correct temperature. The filter 142 and ratio of fresh-to-recycled purge gas are chosen to ensure that the concentration of oxygen and water contamination in the mask stage compartment is kept within acceptable limits, e.g. less than 200 ppm, or preferably less than 20 ppm.

To minimize use of clean purge gas, the free space in the mask stage compartment 100 is kept as small as possible, and to prevent leakage from the compartment into the rest of the machine or into the clean room within which it is used, the compartment 100 may be made double-walled. Within the compartment, sources of contaminants, such as plastic components, adhesives, electronic components, etc. are minimized and significant contamination sources may be separately enclosed and purged. At start-up of the machine, and after any opening of the mask stage compartment 100 for maintenance, a complete flush with fresh purge gas is performed to bring the level of contaminants down to required levels. During this process, the purge gas is not reused due to its relatively high level of contaminants.

In a variant of the purge gas supply system, shown in FIG. 5, a supply of fresh purge gas is avoided by purifying the exhausted purge gas. In this case, a purifier 144 is provided in the air-control cabinet 140 provided in/with the lithographic apparatus and all of the exhausted purge gas extracted by pump/fan 141 is put through this, the filter 142 and heat exchanger 143. The purge gas output from heat exchanger 143 is however not returned directly to the apparatus but passed to a further purifier 151 and heat exchanger 152 provided near to the lithographic apparatus. The purifiers 144, 151 and fan 141 can generate large amounts of heat, electrical noise and vibration and so are preferably isolated from the remainder of the lithographic apparatus as far as possible.

Embodiment 2

A second embodiment of the invention, which may be the same as the first embodiment save as described below, is shown in FIGS. 6 to 18. In the second embodiment, the mask stage compartment is closed by fixed top and bottom purge plates 210, 220 which closely conform to the shape of the mask table MT. Only the projection beam path, and not the interferometer beam paths, is purged.

Figure 6:
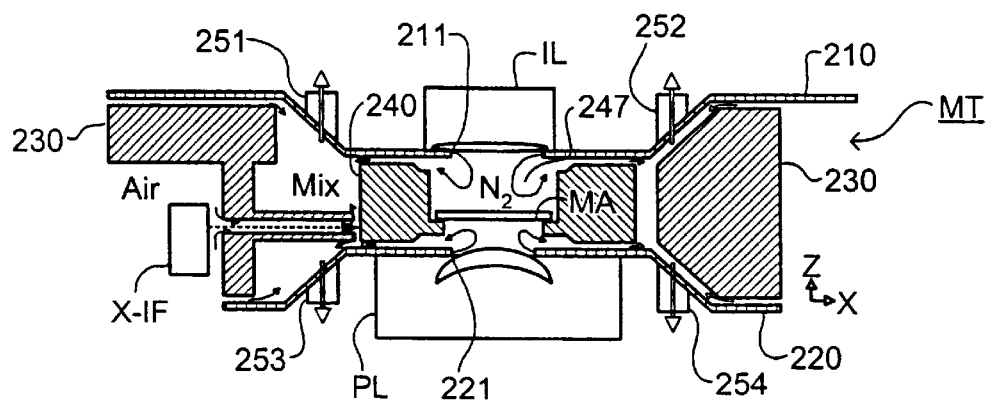
FIG. 6 is a view in cross-section parallel to the ZX-plane of the mask stage of a lithographic projection apparatus according to a second embodiment of the present invention.

As shown in FIG. 6, which is a cross-sectional view looking in the scanning, Y, direction, the mask table comprises a short-stroke frame 230, which is driven by the long-stroke drive arrangement (not shown), and chuck 240. The chuck 240 comprises the mask holder for the mask MA and is driven relative to the short-stroke frame 230 by the short-stroke positioning means (not shown). The upper purge plate 210 is fixed to the base frame BF (shown in FIG. 1) and has an aperture around the illumination system IL. The lower purge plate 220 is fixed to the projection system support structure and includes an aperture around the top element in the projection system PL. Both top and bottom purge plates 210, 220 may be hollow or may include conduits (not shown) for the supply of purge gas. This is supplied to the mask stage compartment via orifices 211, 221 provided in the apertures around the illumination system IL and projection system PL. Thus, the purge gas is vented directly into the central well 247 in chuck 240, which is the region traversed by the projection beam. Exhausts 251, 252, 253, 254 are provided at convenient locations, e.g. between the chuck 240 and short-stroke frame 230 to ensure a flow of purge gas away from the mask MA. This arrangement ensures that exhaust gas can only diffuse into the purge compartment through a narrow slit between short-stroke frame 230 and the purge plates 210, 220 and will be evacuated through exhausts 251–254 before reaching the area of the projection beam.

Figure 7:
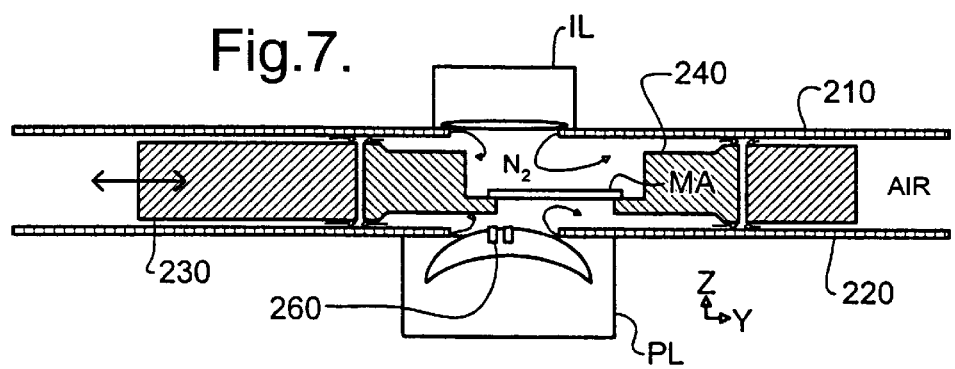
FIG. 7 is a view in cross-section parallel to the ZY-plane of the mask stage of FIG. 6.

FIG. 7 is a cross-sectional view of the mask stage of the second embodiment viewed perpendicular to the scanning direction and shows that the top and bottom purge plates 210, 220 extend along both sides of the illumination and projection systems IL, PL to ensure that the mask table is covered throughout its range of motion. This view also shows the level sensors 260 mounted on the projection lens PL.

Figure 8:
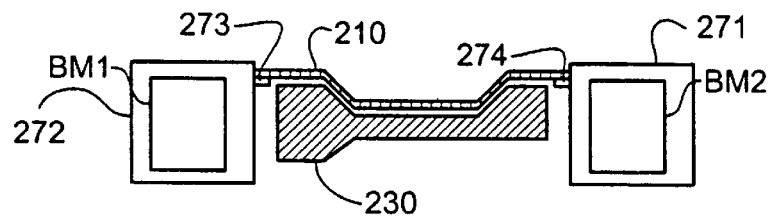
FIG. 8 is a partial, cross-sectional view of the mask stage of FIG. 6 showing the mounting of the upper purge plate.

FIG. 8 shows how the upper purge plate 210 is mounted to compartments 271, 272 for the balance masses BM1, BM2 and the long-stroke drive arrangements, via flanges 273, 274. It can also be seen that the upper purge plate 210 follows the contour of the short-stroke frame 230 with a predetermined gap, e.g. 1 mm. The connections between top purge plate 210 and flanges 273, 274 incorporate arrangements to allow this gap to be adjusted.

The upper and lower purge plates 210, 220 may be made of, for example, honeycomb stainless steel plates. This material is non-magnetic to prevent disturbance forces caused by the motor magnets in the long- and short-stroke drive arrangements.

Figure 9:
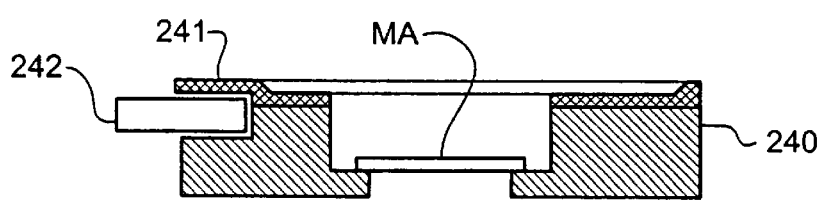
FIG. 9 is a cross-sectional view of the mask table of the mask stage of FIG. 6 showing the cover plate.
Figure 10:
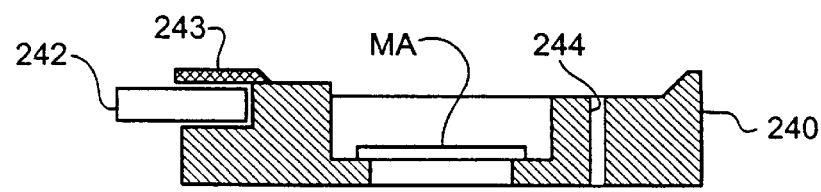
FIG. 10 is a cross-sectional view of a variation of the mask table of the mask stage of FIG. 6 showing a modified cover plate.

To reduce dead spaces and improve gas flow as the mask table is scanned, the upper surface of the chuck 240 is preferably made as smooth as possible. FIGS. 9 and 10 illustrate alternative options for arranging this. In FIG. 9, the whole of the top of the chuck 240, except the mask aperture, is covered by cover plate 241. The cover plate 241 may be formed of a composite material plated with aluminum. In the variants of FIG. 10, only the area over the vertical short-stroke actuator 242 is covered by a cover plate 243, which may again be of composite material.

Figure 11:
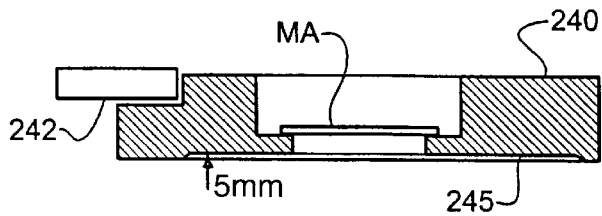
FIG. 11 is a cross-sectional view of the mask table of the mask stage of FIG. 6 showing the shape of the bottom of the table.

To even out pressure variations between the top and the bottom of the chuck 240, through-holes 244, shown in FIG. 10, are provided. These should be sufficient in number and size to allow rapid equalization of any pressure variations that may occur. Additionally, as shown in FIG. 11, a recess 245 can be milled in the lower surface of the chuck 240 so that it has a shape corresponding to the upper surface as far as possible. This serves to equalize any flow, and hence pressure, variations that may occur during movement of the chuck 240.

Figure 12:
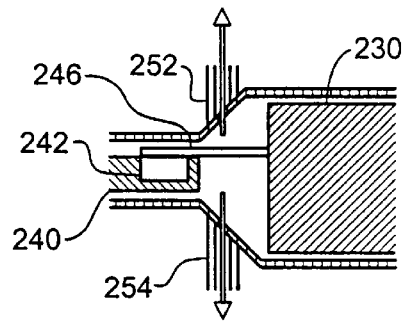
FIG. 12 is a partial, cross-sectional view of the mask table of FIG. 6 showing exhaust arrangements.

FIG. 12 shows in more detail the placement of exhausts 252, 254. As will be seen, these are situated in the oblique parts of the cover plates 210, 220 ensuring that there is sufficient volume in their vicinity to even out pressure variations. This is the case even in the vicinity of the mounting members 246 which span between the short-stroke frame 230 and the gravity compensator (vertical actuator) 242 mounted on the chuck 240.

Figure 13:
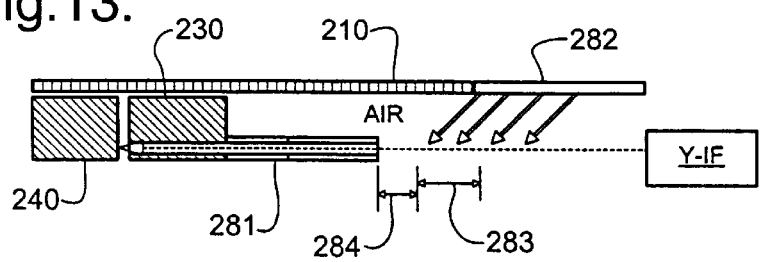
FIG. 13 is a cross-sectional view of an arrangement for conditioning the beam path of an interferometer in the mask stage of FIG. 6.

As mentioned above, it is necessary to ensure that the space traversed by the interferometer beams which measure the position of the chuck 240 is occupied by a gas of constant refractive index. As shown in FIG. 13, an extension pipe 281 is attached to the short-stroke frame 230. The Y-interferometer beam Y-IF passes through the extension pipe 281 and a bore in the short-stroke frame 230 and is reflected by a mirror (not shown) or retro-reflector mounted on the side of the chuck 240. The beam path within the bore in the short-stroke frame 230 and the extension pipe 281 is conditioned by clean purge gas flowing out from the central compartment of the mask stage whilst the greater part of the beam path outside the short-stroke frame is conditioned by the air shower 282. The air shower 282 may direct clean, dry purge gas at an angle towards the scanning range of the short-stroke stage 230 so as to condition a region 283 underneath the purge plate 210. This, and the extension pipe 281, minimizes the unconditioned length 284 of the Y-interferometer beam path.

Figure 14:
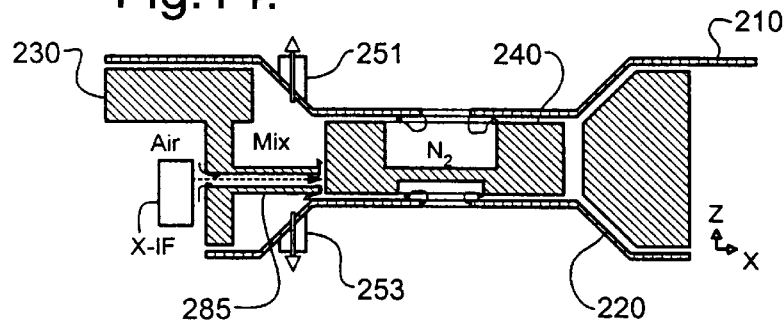
FIG. 14 is a cross-sectional view of the mask stage of FIG. 6 showing a "letter-box" arrangement for passing an interferometer beam into the purge compartment.
Figure 15:
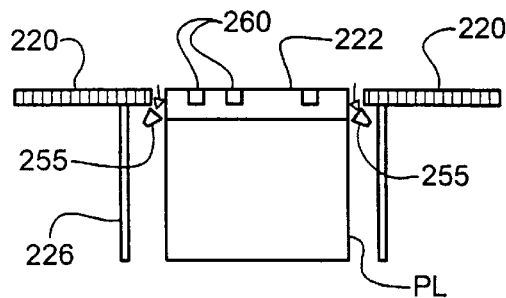
FIG. 15 is a partial, cross-sectional view of the mask stage of FIG. 6 showing the mounting of the lower purge plate to the projection lens.

For the X-interferometer beams, a different arrangement is necessitated by the need to measure the X-position of the chuck 240 throughout its range of scanning movement in the Y direction. As shown in FIG. 14, which is a view similar to FIG. 6 but with certain components removed for clarity, a rectangular opening 285 is provided in the short-stroke frame 230 to allow the beam from X-interferometer X-IF to reach chuck 240. Opening 285 defines a narrow slit in the short-stroke frame 230 extending in the Y-direction for the whole length of the movement range of the short-stroke frame 230. Conditioning air for the X-interferometer beam passes through the opening 285 but this flow is minimized by making the letterbox 285 narrow and extend close to the chuck 240. Conditioning air for the X-interferometer beam mixes with the purge gas in the space between chuck 240 and short-stroke frame 230 but is prevented by pressure differentials from flowing into the inner space where the mask is provided.

Where the top of the projection lens PL presents a flat surface 222, as in FIG. 15, this itself can form the lower boundary of the inner purge compartment. In such an arrangement Z and other sensors 260 are inset into the top of the projection lens compartment. The lower purge plate 220 is then divided into separate parts either side of the projection system PL. The two parts of the lower purge plate 220 are arranged not to contact the projection system PL to prevent transmission of vibrations to the projection system PL. Additional exhausts 255 are provided to remove purge gas leaking through the resultant gap. These can be situated between the main casing of the projection lens PL and an outer lens cooler 226, for example.

Figure 16:
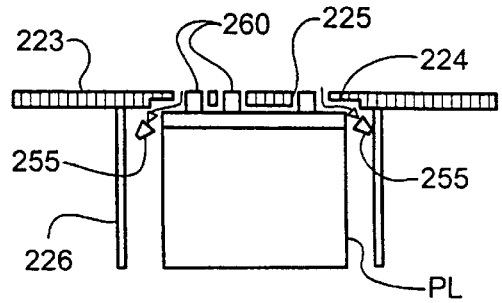
FIG. 16 is a partial, cross-sectional view of the mask stage of FIG. 6 showing an alternative arrangement for mounting the lower purge plate to the projection lens.

In an alternative arrangement, shown in FIG. 16, where the Z and other sensors 260 extend above the top of the projection lens, the lower purge plate 223 is formed to extend over the top of the projection lens with a central aperture (not shown) for the projection beam and additional apertures 225 for the sensors 260. Cut-aways 224 in the lower part of the purge plate 223 can be provided to enable a close fit to the projection system PL whilst avoiding actual contact.

Figure 17:
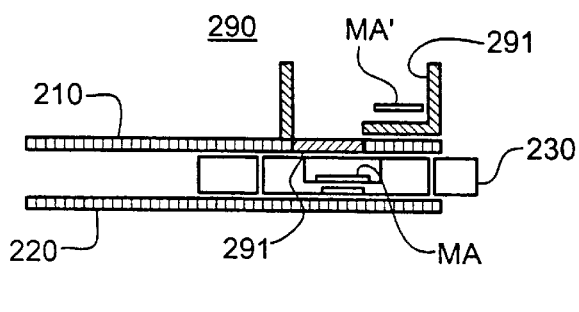
FIG. 17 is a partial, cross-sectional view of the mask stage of FIG. 6 showing the arrangements for mask exchange.
Figure 18:
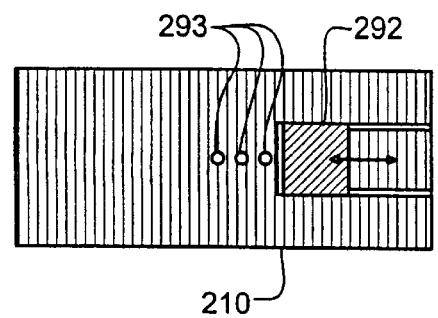
FIG. 18 is a partial plan view of the upper purge plate of the mask stage of FIG. 6 showing the mask exchange opening.

To avoid the need to re-flush the complete mask stage compartment with clean purge gas after mask exchange, the mask exchange is arranged to occur in purge gas. To effect this, the upper and lower purge plates 210, 220 extend underneath the mask handler 290, shown in FIGS. 17 and 18. FIG. 17 is a cross-sectional view of the mask handler 290 and FIG. 18 is a plan view of the upper purge plate 210 in this area. The mask handler 290 includes a closed compartment 291 in which the replacement mask MA' can be provided in advance of the exchange procedure. The chamber 291 can be separately flushed with purge gas and a motorized door 292 is provided in the upper purge plate 210 to allow for exchange when the mask table is positioned underneath it. As shown in FIG. 18, additional purge gas outlets 293 are provided in the vicinity of the motorized door 292 to provide positive pressure differential of purge gas during mask exchange and thereby prevent any contamination reaching the purge compartment.

Embodiment 3

Figure 19:
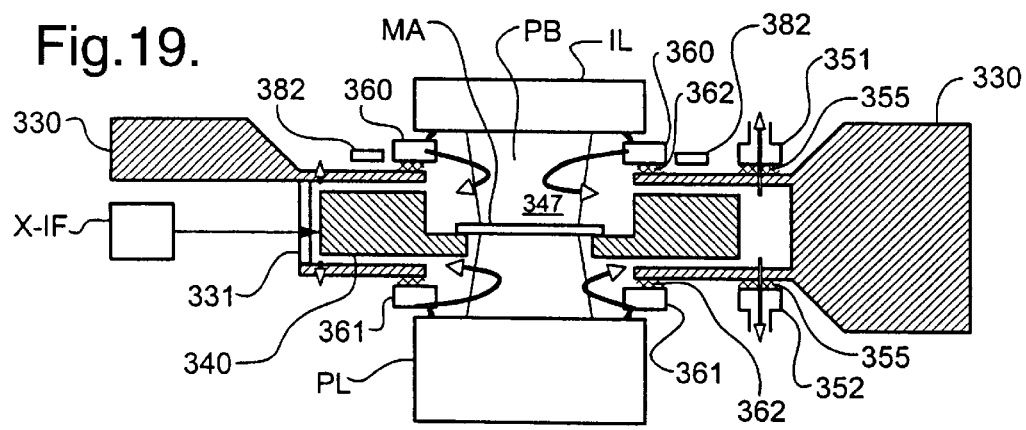
FIG. 19 is a cross-sectional view of the mask stage of a lithographic projection apparatus according to a third embodiment of the present invention.
Figure 20:
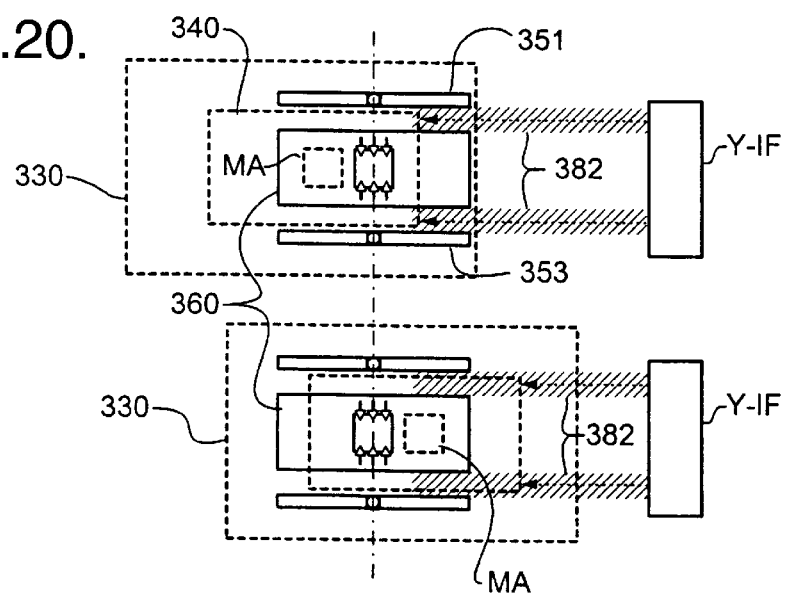
FIG. 20 shows the mask stage of FIG. 19 in plan with the mask table in two extreme positions of its scanning motion.

A third embodiment of the invention, which may be the same as the first or second embodiments save as described below, is shown in FIGS. 19 and 20. In the third embodiment, the short-stroke frame 330 is formed into a largely closed box surrounding the chuck 340.

The short-stroke frame 330 is driven by the long-stroke motors (not shown) and thus makes large scanning moves in the Y-direction. Within the short-stroke frame 330, the chuck 340 is suspended by vertical actuators (not shown). Such actuators might require the supply of compressed gas, which should then be supplied with purge gas. The purge gas supplies 360, 361 to the main mask stage compartment are mounted to the illumination system IL and projection system PL and are therefore stationary. The exhausts 351, 352 are also fixed relative to the illumination and projection systems IL, PL and are situated towards the lateral edge of the closed box formed by the short-stroke frame 330. The exhausts 351, 352 take purge gas, through orifices (not shown) in the short-stroke frame, from the space between the edges of the chuck 340 and the short-stroke 330 so that there is a flow of purge gas from the inner area of the closed compartment, the well 347 in the chuck 340, outwards. Note that exhausts are also provided on the other side of the short-stroke frame from exhausts 351, 352 shown in FIG. 19 but these exhausts have been omitted from the Figure for clarity. As the purge gas supplies 360, 361 and exhausts 351, 352 are stationary whilst the short-stroke frame 330 scans in the Y-direction, gas bearings 362, 355 are provided between the supplies 360, 361 and short-stroke stage 330 and between the exhausts 351, 352 and the short-stroke frame 330. At least the gas bearings 362 are provided with purge gas to prevent leakage into the inner compartment. The short-stroke frame 330 can move vertically to a small degree and this is accommodated by the gas bearings 362, 355.

FIG. 20 shows the short-stroke frame 330, chuck 340 and mask MA in the extremes of their scanning motion relative to the purge gas supply 360 and exhausts 351, 352. As can there be seen, the apertures in the closed box formed by the short-stroke stage 330, which closely surround the footprint of the mask MA, passes under the purge gas supply in the middle portion of its scan, when the exposure is effected, but is closed at the extremes.

To enable measurement of the position of the chuck 340, a membrane 331 forms a window in one side of the closed box formed by the short-stroke stage 330 to allow the X-interferometer measurement beam to be incident on a mirror (not shown) provided on the side of the chuck. The membrane 331 extends in the Y-direction sufficiently to allow the X-position of the chuck 340 to be measured throughout the scanning motion of the chuck 340 and short-stroke frame 330. Smaller windows can be provided to allow in the beams from the Y-interferometers Y-IF since these need only accommodate the relatively small range of movement of the chuck 340 in the X-direction. The air shower 382 for conditioning the Y-interferometer beam extends above the short-stroke frame 330 and can condition the beams from the Y-interferometer Y-IF throughout the scanning range of the short-stroke frame 330 and chuck 340.

Embodiment 4

A fourth embodiment, which may be the same as the first to third embodiments save as described below, is shown in FIGS. 21 to 23. In the fourth embodiment, the short-stroke frame 430 forms an open, moving purge-box which is closed by fixed supply and exhaust bins 411, 412.

FIG. 21 is a cross-sectional view of the mask stage of embodiment 4 viewed in the scanning, Y, direction. The short-stroke frame 430 forms a partially-open box surrounding the chuck 440. The short-stroke frame 430 is driven for the scanning motion by the long-stroke drive (not shown) whilst the chuck 440 is supported from the short-stroke frame 430 by vertical actuators (not shown) and makes small movements in all degrees of freedom. The upper exhaust bin 411 is fixed with respect to the illumination system IL and provides purge gas to the inner compartment above the mask MA. This gas flows outwardly past restrictions between the short-stroke frame 430 and chuck 440 and is exhausted upwardly from above the sides of the chuck 440 by exhausts 450. Lower exhaust bin 412 is similarly fixed relative to projection lens PL and exhausts gas from around the first element of the projection system PL so as to purge the space below the mask MA.

As shown in FIG. 21, the partially-open box provided by the short-stroke frame 430 leaves one side of the chuck 440 free so that it can be measured directly by the beams from the X-interferometer X-IF. As shown in FIG. 22, which is a cross-sectional view in the X-direction, a bore 431 is provided in one side of the short-stroke frame 430 to allow the beam from the Y-interferometer Y-IF through to the chuck 440.

Since the short-stroke frame 430 will move relative to the upper and lower supply and exhaust bins 411, 412, gas bearings 413 are provided in the upper and lower supply and exhaust bins 411, 412. One of these gas bearings is shown in greater detail in FIG. 23. As can there be seen, purge gas is supplied through supply conduit 414 to form gas bearing 413 in the space between the supply and exhaust bin 411 and the short-stroke frame 430. The purge gas from the gas bearing will leak inwardly towards the exhausts 450 and outwardly towards ambient air. An additional exhaust conduit 415 is provided between the supply conduit 414 and ambient air to exhaust leaking purge gas for recycling and to prevent inward leaks of air. The gas bearings 413 can be pre-stressed by a pressure differential between ambient air and the inner purge compartment, magnetically, by additional vacuum areas or using additional mass, for example.

The fourth embodiment minimizes the volume that must be purged. Additional purge gas outlets on the short-stroke frame 430 itself can be provided, with nitrogen supplied to the short-stroke frame 430 by a simple, or double-walled, pipe. The Z-sensors 460 mounted to the projection lens can be repositioned outwardly so as to measure the position of the chuck 440 outside the lower supply and exhaust bin 412 and if necessary through a window 432 provided in the short-stroke frame 430.

Figure 24:
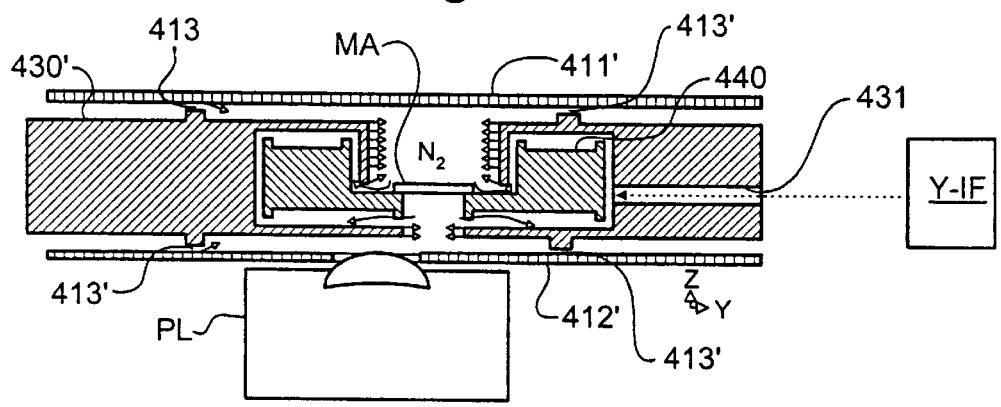
FIGS. 24 to 26 are cross-sectional views of the mask stage of a variant of the fourth embodiment with the mask table in different positions.
Figure 25:
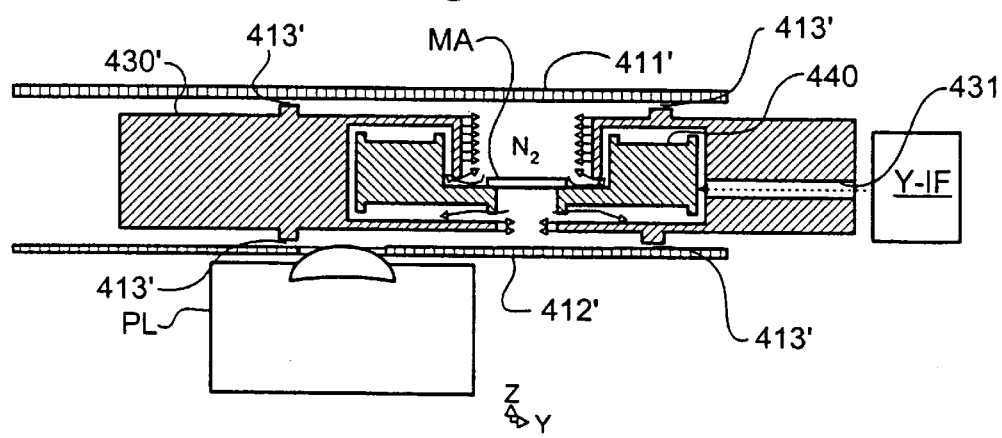
Figure 26:
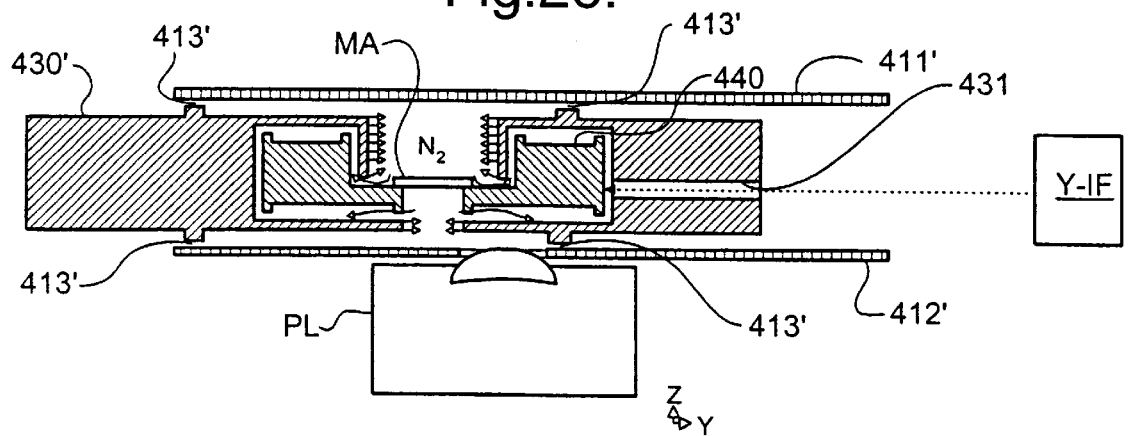

A variant of the fourth embodiment is shown in FIGS. 24, 25 and 26. In the variant of the fourth embodiment, the principal change is that the gas bearings 413' are moved to be on the short-stroke frame 430', rather than the purge plate. The gas bearings 413' therefore bear against the flat inner surfaces of the purge plates 411', 412'. Purge gas can be supplied to the short-stroke frame 430 for the bearings by a flexible single- or double-walled pipe. In the fourth embodiment, a flat surface equal in length to the scanning motion of the mask table in the Y direction must be provided for the gas bearings 413 or 413' to bear against. In the variant of FIGS. 24 to 25, this flat surface is provided on the fixed purge plates allowing the size of the moving wafer table to be reduced, reducing the moving mass.

In other variations of the fourth embodiment, the lower supply and exhaust bin 412 can be integrated into the casing for the projection system PL or as an extension of the IL structure. Additionally, the exhaust can be taken only from the upper purge plate with through-holes provided in the chuck 440 to ensure no pressure differential between the sides of the chuck 440 arises.

Embodiment 5

Figure 27:
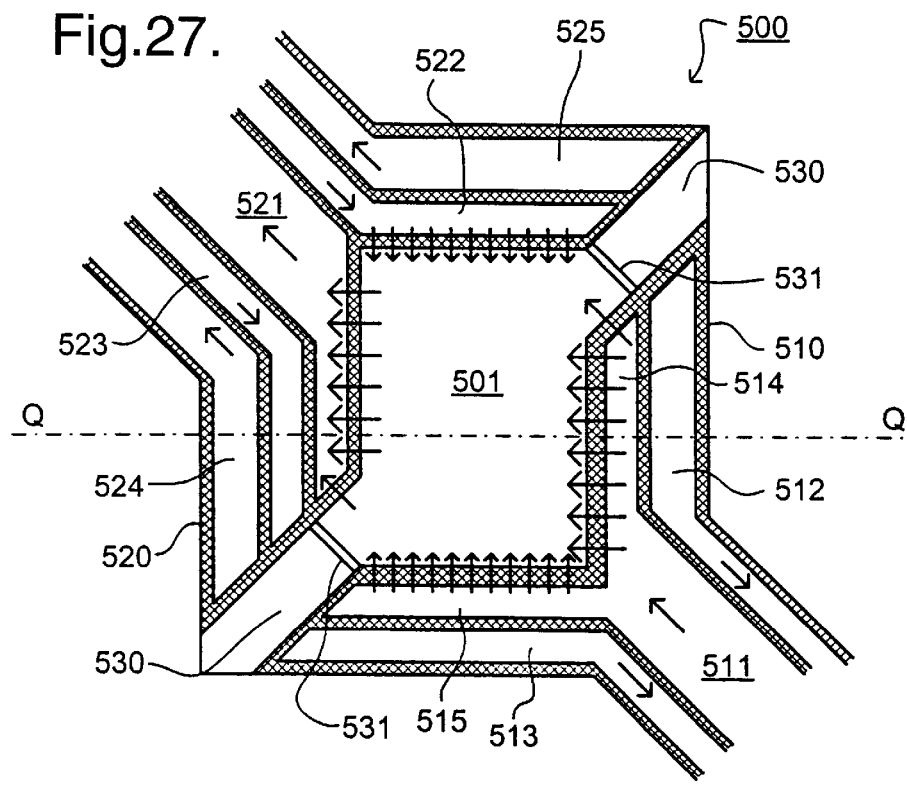
FIG. 27 is a horizontal cross-section of a purge gas system in the substrate stage of a lithographic projection apparatus according to a fifth embodiment of the present invention.
Figure 28:
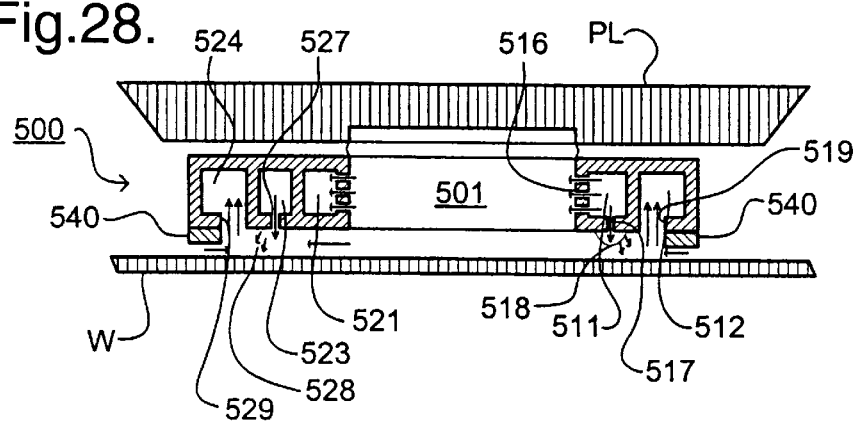
FIG. 28 is a cross-sectional view along the line Q—Q in FIG. 27 of the substrate stage of the fifth embodiment of the present invention.
Figure 29:
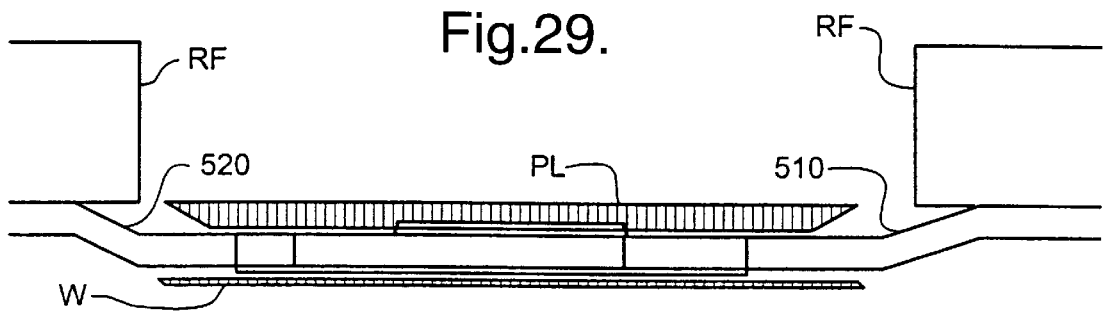
FIG. 29 is a side view of the purge gas system of FIG. 27.

A fifth embodiment is shown in FIGS. 27 to 29. The fifth embodiment provides a purge box arrangement for the substrate (wafer) stage of the lithographic projection apparatus and may be combined with any of the embodiments described above.

FIG. 27 shows a horizontal cross-section of the substrate stage purge box 500 which comprises first and second duct enclosures 510, 520 surrounding central area 501 which is situated underneath the final element of the projection lens PL. FIG. 28 is a vertical cross-section along the line Q—Q in FIG. 27 with the vertical scale exaggerated for clarity. First duct member 510 provides the major supply of purge gas to the central area 501 through main supply conduit 511. Either side of main supply channel 511 are exhaust channels 512 and 513. The main supply channel 511 ends in two arms 514, 515 extending along the first and second sides of the rectangular central area 501. The side walls of arms 514, 515 are provided with an array of orifices 516 (shown in FIG. 28) through which the purge gas is provided to the central area 501. The bottom surfaces of arm channels 514, 515 are also provided with orifices 517 (shown in FIG. 28) through which the purge gas exits to form gas bearings 518 to keep duct member 510 off the substrate W. The exhaust channels 512, 513 have an array of larger orifices 519 in their lower surfaces for exhausting purge gas from the gas bearings 518 and any air leaking in from the outside.

The second duct member 520 carries the major exhaust channel 521 which extends along the third side of central area 501 and is used to remove the bulk of the purge gas from one side of central area 501. Secondary supply channels 522, 523 are provided either side of main exhaust channel 521. Secondary supply channels 522, 523 have an array of orifices 527 in their lower surfaces so as to form gas bearings 528 to keep the second duct member 520 off substrate W. Outermost in second duct member 520 are secondary exhaust channels 524, 525 which have orifices 529 in their lower surfaces, similarly to exhaust channels 512, 513 in the first duct member, for exhausting purge gas from the gas bearings 528 and preventing any air that may leak under the second duct member 520 from reaching the central area 501. FIG. 25 also shows an outer skirt 540 which is provided around the periphery of first and second duct members 510, 520. This serves to limit the flow of air leaking underneath the first and second duct members 510, 520 to the central area 501.

As can be seen in FIG. 27, the first and second duct members 510, 520 do not meet but leave a clear diagonal channel 530, closed adjacent the central area 501 by windows 531, for sensors, e.g. level sensors, which need to observe the surface of the wafer immediately underneath the projection lens PL. If no such sensors are necessary in the apparatus, the clear channel 530 may be omitted.

FIG. 28 is a side view showing that the first and second duct members 510, 520 are mounted to the reference, or metrology, frame RF.

Purge Gas Compositions

In all of the embodiments described above, the purge gas may, for example, comprise very pure nitrogen, $N_2$, or a gas selected from the group He, Ne, Ar, Kr and Xe, or a mixture of two or more of any of these gases. The gas composition used is one which is substantially transparent to UV radiation of the wavelength of the projection beam and preferably has a refractive index which is substantially the same as that of air, when measured under the same conditions of temperature and pressure (e.g. standard clean room conditions) and using radiation of the same wavelength. The refractive index should preferably be the same as that of air at the wavelength of a radiation beam used in the interferometric displacement measuring means IF. The pressure of the purge gas in the mask and/or substrate stages may be atmospheric pressure, or it may be above atmospheric pressure so that any leak results in an outflow of gas rather than contaminating the system with incoming air. Further details of suitable purge gasses can be found in co-pending European patent application number 00306022.5 (Applicant's ref P-0197.000-EP). Preferred mixtures of gases include:

97.3 vol. % $N_2$ and 2.7 vol. % He
97.0 vol. % $N_2$ and 3.0 vol. % Ne
59.0 vol. % $N_2$ and 41.0 vol. % Ar
97.5 vol. % Ar and 2.5 vol. % Xe
92.9 vol. % Ar and 7.1 vol. % Kr.

Whilst we have described above specific embodiments of the invention it will be appreciated that the invention may be practiced otherwise than described. The description is not intended to limit the invention.

What is claimed is:

1. A lithographic projection apparatus comprising:
   an illumination system constructed and arranged to supply a projection beam of radiation;
   a first object table for holding a mask;
   a second object table for holding a substrate;
   a projection system constructed and arranged to image an irradiated portion of said mask onto a target portion of said substrate;
   a compartment supplied with a purge gas, and at least one of said first and second object tables being inside the compartment, and said illumination system and said projection system being outside of the compartment, the purge gas being more transparent than air to the radiation of said projection beam,
   wherein said object table which is disposed within said compartment is moveable relative to said projection system and said compartment is arranged to move with said object table.

2. Apparatus according to claim 1 wherein said compartment surrounds said first object table.

3. Apparatus according to claim 2 wherein said compartment is mounted to a long-stroke positioner constructed and arranged to position said first object table.

4. Apparatus according to claim 1 wherein first object table comprises a frame surrounding said object table, and said compartment comprises said frame and first and second purge plates closely conforming to upper and lower surfaces of said first object table respectively.

5. Apparatus according to claim 4 wherein said first and second purge plates have apertures respectively corresponding to the illumination and projection systems and purge gas supply orifices surrounding said apertures.

6. Apparatus according to claim 4 wherein said first and second purge plates extend to a region occupied by a mask exchange device.

7. Apparatus according to claim 1 wherein said first object table comprises a box generally surrounding said first object table to provide said compartment.

8. Apparatus according to claim 1, wherein windows are provided in said first object table to allow measurement beams to pass through said first object table.

9. Apparatus according to claim 1, further comprising:
   upper and lower plates, fixed relative to said illumination and projection systems respectively, and forming said compartment; and
   gas bearings provided between said upper and lower plates and said first object table.

10. Apparatus according to claim 1 wherein the purge gas comprises one or more gases selected from the group consisting of:
    $N_2$, He, Ar, Kr, Ne and Xe.

11. Apparatus according to claim 1 wherein said radiation of said projection beam has a wavelength less than 180 nm.

12. Apparatus according to claim 11 wherein said radiation of said projection beam has a wavelength selected from the group consisting of: between 152 nm and 162 nm and between 121 nm and 131 nm.

13. Apparatus according to claim 1 wherein said compartment surrounds second object table.

14. A method of manufacturing a device comprising:

providing a substrate provided with a radiation-sensitive layer to a second object table;

irradiating portions of a mask bearing a pattern and positioned on a first object table and imaging said irradiated portions of the mask onto said target portions of said substrate;

providing purge gas to a compartment in which at least one of said first and second object tables is contained, said compartment being movable with said object table which is contained within, and wherein said illumination system and said projection system are disposed outside of said compartment, and wherein said purge gas is more transparent than air to the radiation of said projection beam.

15. A semiconductor device manufactured using a lithographic projection apparatus according to the method of claim 14.

* * * * *